US012772790B2

(12) United States Patent
Yamaoka et al.

(10) Patent No.: US 12,772,790 B2
(45) Date of Patent: Oct. 20, 2026

(54) DEVICE TRANSFER METHOD, DEVICE TRANSFER MACHINE, TARGET OBJECT TRANSFER METHOD, AND TARGET OBJECT TRANSFER MACHINE

(71) Applicant: Shin-Etsu Chemical Co., Ltd., Tokyo (JP)

(72) Inventors: Hiroshi Yamaoka, Yokohama (JP); Satoki Nakada, Yokohama (JP); Nobutaka Uemori, Kashiwa (JP); Takeshi Saito, Yokohama (JP); Shusaku Ozawa, Funabashi (JP); Shinichi Sato, Sakura (JP); Taketo Usami, Shinagawa-ku (JP); Masami Kurata, Nerima-ku (JP); Masahiko Sato, Edogawa-ku (JP); Tsukasa Abe, Meguro-ku (JP); Tsuyoshi Noguchi, Adachi-ku (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 283 days.

(21) Appl. No.: 18/027,798

(22) PCT Filed: Sep. 27, 2021

(86) PCT No.: PCT/JP2021/035268
§ 371 (c)(1),
(2) Date: Mar. 22, 2023

(87) PCT Pub. No.: WO2022/071187
PCT Pub. Date: Apr. 7, 2022

(65) Prior Publication Data

US 2023/0343625 A1 Oct. 26, 2023

(30) Foreign Application Priority Data

Sep. 29, 2020 (JP) ................................ 2020-163943

(51) Int. Cl.
*H10P 72/50* (2026.01)
*H10P 72/00* (2026.01)
(Continued)

(52) U.S. Cl.
CPC .......... *H10P 72/50* (2026.01); *H10P 72/0442* (2026.01); *H10P 72/0608* (2026.01);
(Continued)

(58) Field of Classification Search
CPC ............... H01L 21/68; H01L 21/67132; H01L 21/67265; H01L 21/6835; H01L 25/0753;
(Continued)

(56) References Cited

U.S. PATENT DOCUMENTS

| | | | |
|---|---|---|---|
| 2006/0007297 | A1 | 1/2006 | Doi et al. |
| 2009/0073405 | A1 | 3/2009 | Kanaya |

(Continued)

FOREIGN PATENT DOCUMENTS

| | | | |
|---|---|---|---|
| CN | 111312865 | A | 6/2020 |
| CN | 111498471 | A | 8/2020 |

(Continued)

OTHER PUBLICATIONS

International Preliminary Report on Patentability and Written Opinion issued in corresponding International Patent Application No. PCT/JP2021/035268 dated Apr. 13, 2023.

(Continued)

*Primary Examiner* — Andrew L Swanson
(74) *Attorney, Agent, or Firm* — Morgan, Lewis & Bockius LLP

(57) ABSTRACT

Proposed are a method and an apparatus for transferring devices arranged on a first substrate to a second substrate by using laser light while correcting positional deviations of the devices. The present invention involves: acquiring actual positional information about devices on the first substrate;
(Continued)

performing grouping in accordance with a criterion determined on the basis of an allowable positional deviation amount; correcting, for each group unit, a position of the first substrate such that positions of the devices fall into a range of an allowable positional deviation amount; and applying laser light from the back surface of the first substrate and transferring the devices to the second substrate.

16 Claims, 6 Drawing Sheets

(51) Int. Cl.
*H10P 72/70* (2026.01)
*H10W 90/00* (2026.01)

(52) U.S. Cl.
CPC ............. *H10P 72/74* (2026.01); *H10W 90/00* (2026.01); *H10P 72/744* (2026.01)

(58) Field of Classification Search
CPC ........... H01L 2221/68381; H10P 72/50; H10P 72/0442; H10P 72/0608; H10P 72/74; H10P 72/744; H10W 90/00
See application file for complete search history.

(56) References Cited

U.S. PATENT DOCUMENTS

| | | | | |
|---|---|---|---|---|
| 2010/0258543 | A1* | 10/2010 | Mizuno | H10P 34/42 219/121.72 |
| 2011/0151602 | A1* | 6/2011 | Speier | H01L 21/6835 438/26 |
| 2012/0127450 | A1 | 5/2012 | Kanaya | |
| 2016/0219702 | A1* | 7/2016 | Chaji | H10P 72/74 |
| 2017/0215280 | A1* | 7/2017 | Chaji | H01L 21/6835 |
| 2018/0218935 | A1* | 8/2018 | Kuwahara | H10P 72/0606 |
| 2019/0107498 | A1 | 4/2019 | Urano et al. | |
| 2019/0129036 | A1 | 5/2019 | Valouch et al. | |
| 2019/0221466 | A1* | 7/2019 | Arai | H01L 24/81 |
| 2020/0105570 | A1* | 4/2020 | Peterson | H10P 72/7402 |
| 2020/0227379 | A1 | 7/2020 | Huang et al. | |
| 2020/0357950 | A1* | 11/2020 | Takagi | H10H 20/01 |
| 2022/0069159 | A1* | 3/2022 | Takagi | H01L 25/0753 |

FOREIGN PATENT DOCUMENTS

| | | | |
|---|---|---|---|
| JP | 2000-165095 | A | 6/2000 |
| JP | 2006-041500 | A | 2/2006 |
| JP | 2008-041712 | A | 2/2008 |
| JP | 2014-036060 | A | 2/2014 |
| JP | 2016-040854 | A | 3/2016 |
| JP | 2019-068055 | A | 4/2019 |
| JP | 2019-176129 | A | 10/2019 |
| TW | 200931186 | A | 7/2009 |
| WO | 2017/149689 | A1 | 9/2017 |
| WO | 2020/188780 | A1 | 9/2020 |

OTHER PUBLICATIONS

Taiwanese Search Report (with partial translation) dated Sep. 25, 2024, issued in corresponding Taiwanese Patent Application No. 110134623.
International Search Report issued in corresponding International Patent Application No. PCT/JP2021/035268 dated Nov. 2, 2021.
Taiwanese Search Report issued on Aug. 19, 2025 for the corresponding Taiwanese Application No. 114119971.
Office Action and Search Report issued in corresponding Chinese Patent Application No. 202180065159.X. dated Sep. 5, 2025.
Search Report issued in corresponding Chinese Patent Application No. 202180065159.X, dated Mar. 11, 2026.
Search Report issued in corresponding Taiwanese Patent Application No. 115114456, dated Jul. 22, 2026.

* cited by examiner

[FIG. 1]
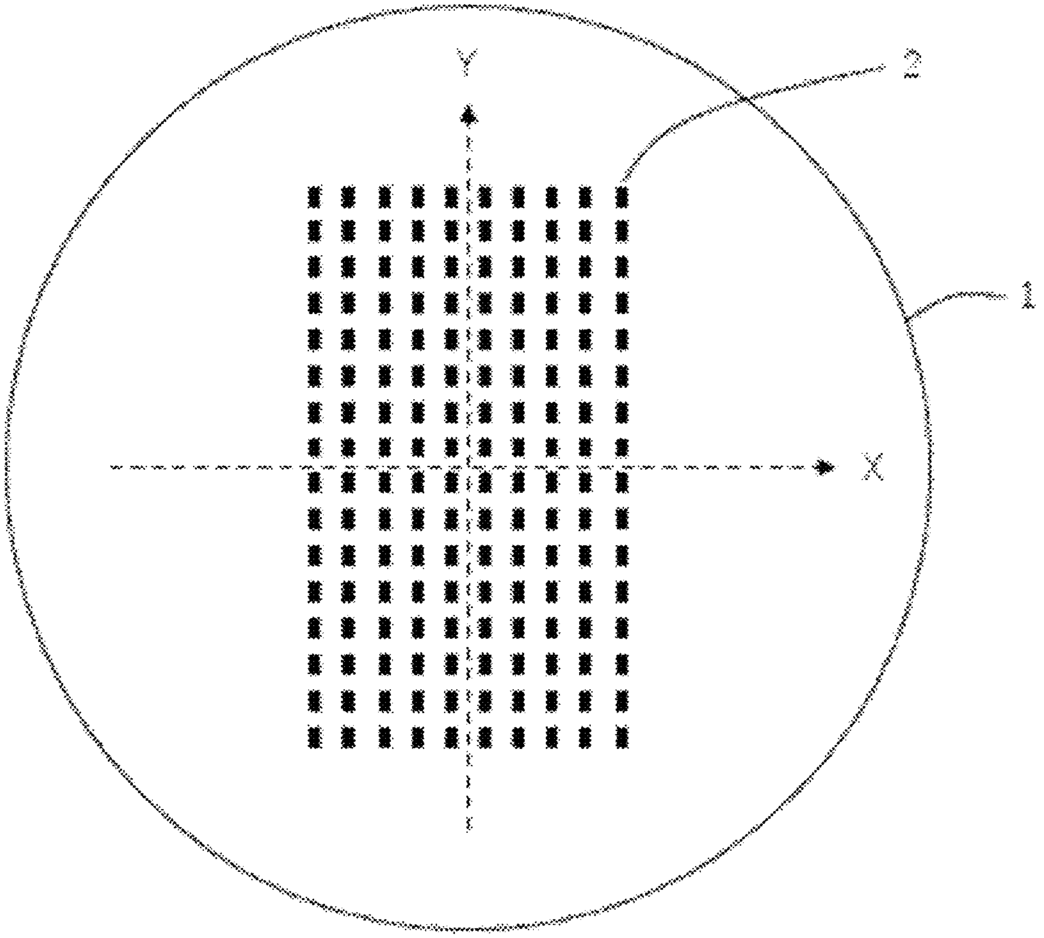

[FIG. 2]
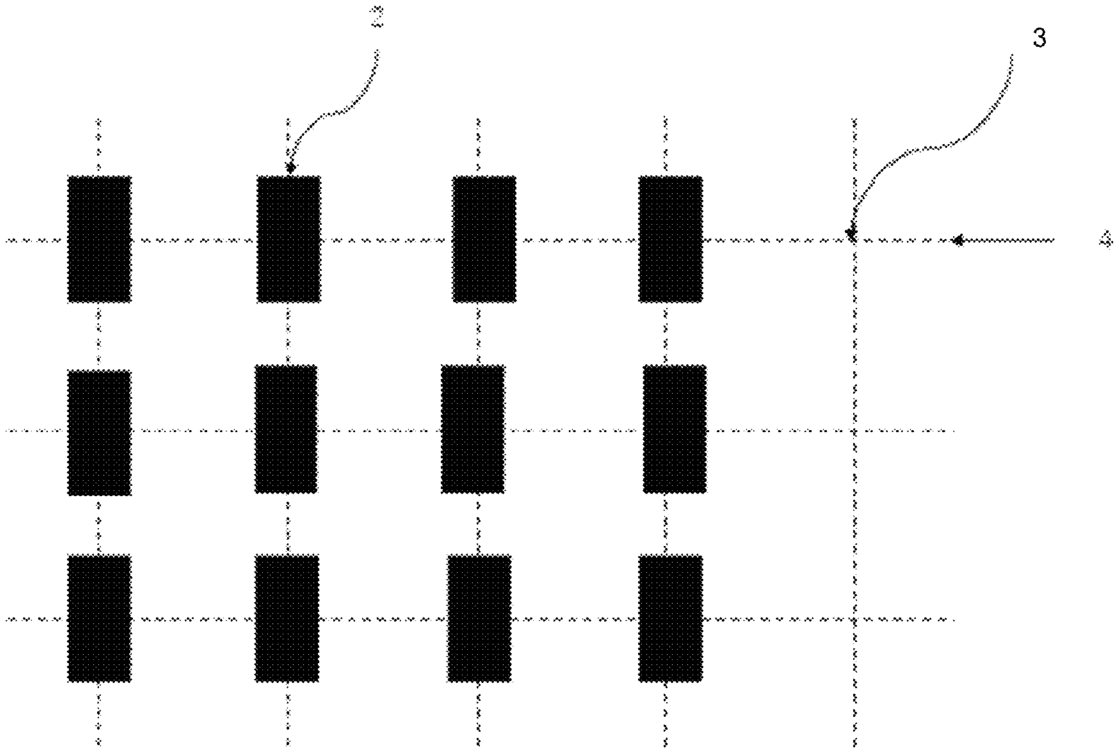

[FIG. 3]
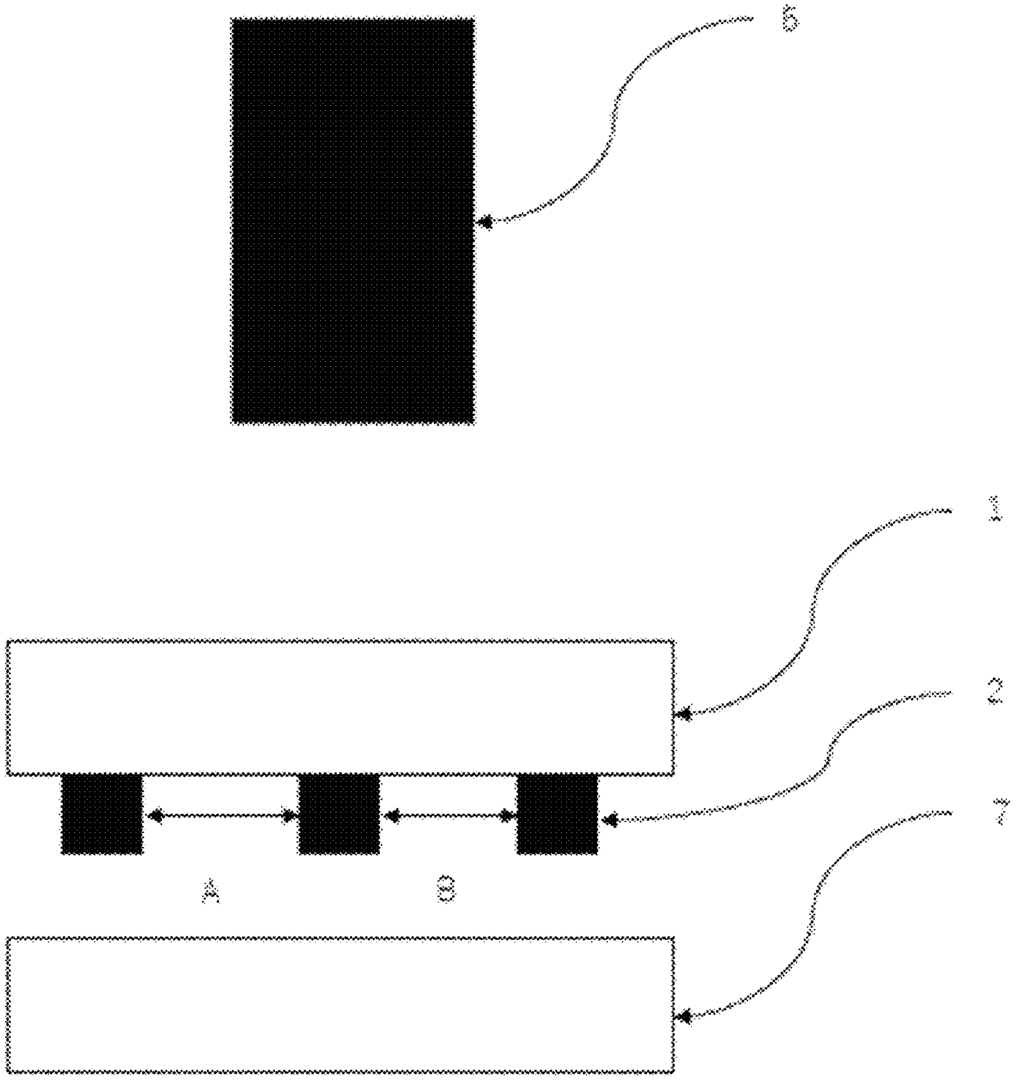

[FIG. 4]
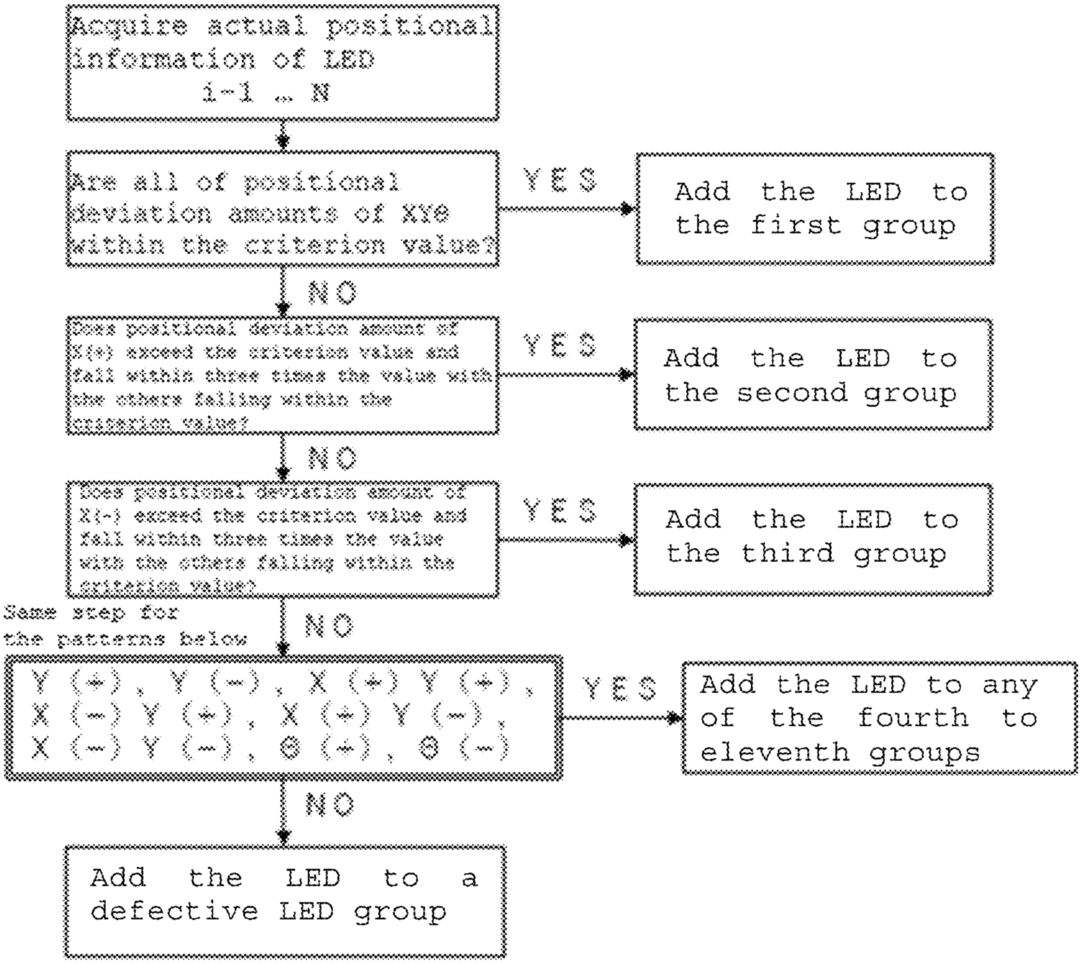

[FIG. 5]
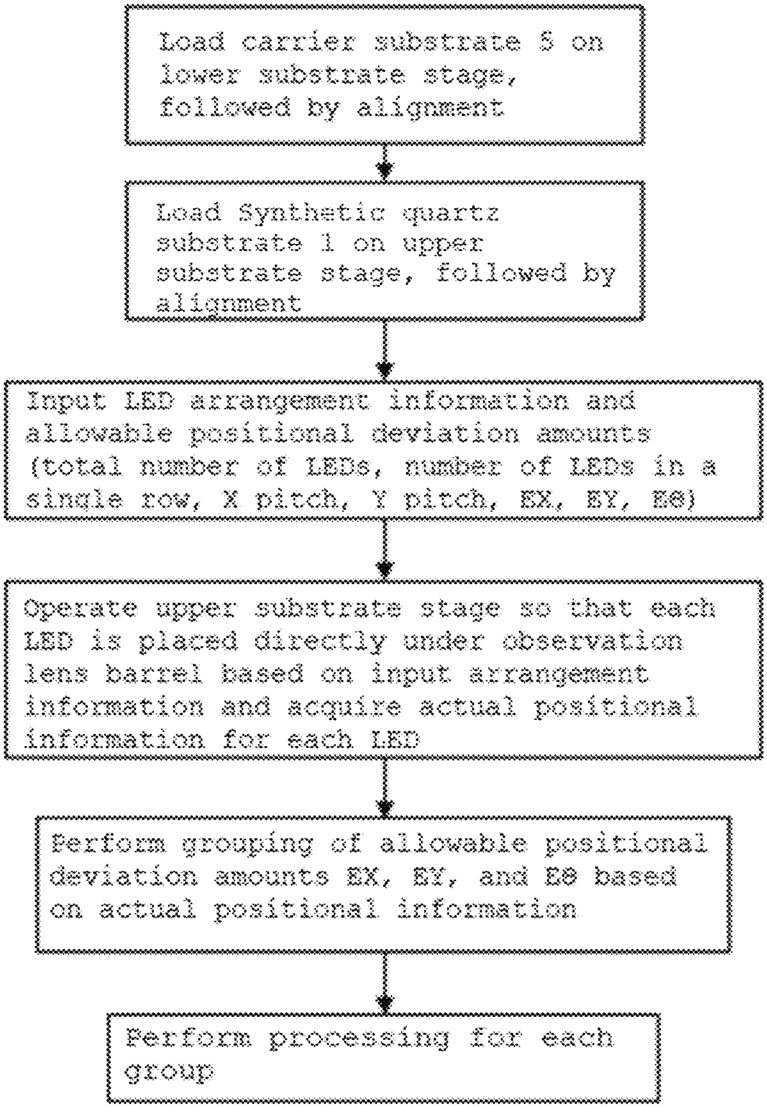

[FIG. 6]
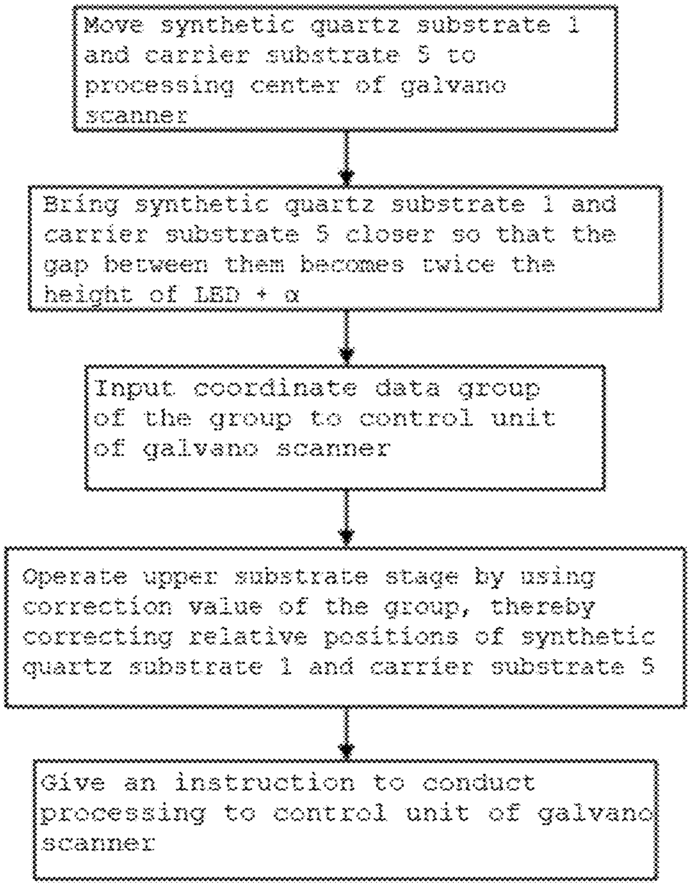

DEVICE TRANSFER METHOD, DEVICE TRANSFER MACHINE, TARGET OBJECT TRANSFER METHOD, AND TARGET OBJECT TRANSFER MACHINE

TECHNICAL FIELD

The present invention relates to a device transfer method, a device-transfer machine, a target-object transfer method, and a target-object transfer machine.

BACKGROUND ART

In recent years, an optical device of a nitride semiconductor has been used as a backlight of a liquid crystal display or a display for signage. In these applications, since a large number of optical devices are used at once, a high-speed transfer technique is required. As a high-speed transfer technique, batch transfer by a stamp method or the like has been performed, and it has become possible to transfer about 1000 to several tens of thousands of devices at once.

The manufacture of micro devices having a size of up to about 100 μm has been performed as in an extension of a manufacturing process of previously-known semiconductor devices. A dicing tape is attached to the semiconductor wafer, then each device is divided by scribing or internal crack formation using a mechanical dicer or laser irradiation, and then the dicing tape is stretched to increase the gap between the individual devices to allow the handler to pick up the devices. The positional accuracy in the stretching of the dicing tape is about ±30 μm.

CITATION LIST

Patent Literature

Patent Document 1: JP 2014-036060 A
Patent Document 2: JP 2006-041500 A

SUMMARY OF INVENTION

Technical Problem

Although the positional accuracy in the stretching of the dicing tape is about ±30 μm, which is acceptable in terms of enabling the handler to pick up individual devices for transfer, there is a problem that this positional accuracy directly becomes the mounting accuracy of the devices when the batch transfer is performed by a stamp method or the like.

Patent Document 1 proposes a method in which the amount of positional deviation of each device is measured before the transfer, and the devices are transferred to a bonding sheet while correcting the amount of positional deviation for each device. However, in this method, the devices are transferred one by one, and a large amount of time is required if using one machine. Although it is possible to use a plurality of machines, the cost is increased, and the benefit of the high-speed transfer technique in the post-process cannot be obtained.

Further, although Patent Document 2 proposes a technique of selectively transferring micro devices at high speed using a galvano scanner, Patent Document 2 nowhere discloses a method of correcting positional deviations in an array of devices to be transferred.

To this end, the present invention proposes a method for solving the above problem, i.e., attaining both the improvement in positional accuracy and high speed.

Solution to Problem

In order to solve the above problems, a device transfer method for transferring devices from a first substrate to a second substrate according to the present invention is mainly characterized by using the first substrate having a surface on which devices are mounted at approximately equal intervals in a state exceeding an allowable positional deviation amount, and the second substrate arranged to face the first substrate with an approximately uniform gap and configured to have an adhesive layer on a surface, the method comprising the steps of: acquiring actual positional information of the devices on the first substrate; comparing the actual positional information with ideal positional information and grouping the devices based on a predetermined criterion determined from the allowable positional deviation amount; selecting a group to be transferred; correcting relative positions of the first substrate and the second substrate in a substrate plane direction based on the predetermined criterion of the selected group; and continuously irradiating only the devices included in the selected group with laser from a back surface of the first substrate to transfer the devices to the second substrate.

Advantageous Effects of Invention

By transferring the devices while correcting the positional deviation amount for each group as described above, there can be provided an effect of producing second substrates having positional accuracy in which all transferred devices have allowable positional deviation amounts at high speed.

BRIEF DESCRIPTION OF DRAWINGS

FIG. 1 is a diagram showing a configuration of an LED supply substrate according to an embodiment of the present invention.

FIG. 2 is a schematic diagram showing an arrangement of LEDs according to an embodiment of the present invention (In the drawing, each LED has a positional deviation to some extent.)

FIG. 3 is a schematic diagram showing acquisition of actual positional information of LED according to an embodiment of the present invention.

FIG. 4 is a diagram showing an algorithm for grouping LED according to an embodiment of the present invention.

FIG. 5 is a diagram showing a flow of transfer operation of a device-transfer machine according to an embodiment of the present invention.

FIG. 6 is a diagram showing a flow of processing operation of a device-transfer machine according to an embodiment of the present invention.

DESCRIPTION OF EMBODIMENTS

Hereinbelow, an example of an embodiment of the present invention is described. In all drawings, for ease of recognition of each component on the drawings, the size and ratio of each component are appropriately changed from those of an actual component.

In the present embodiment, each device is described as an LED (light-emitting diode) of a GaN (gallium nitride)-based semiconductor. In general, in an LED manufacturing company, a large number of LEDs are formed on a sapphire substrate, after this process, a dicing tape is attached to the sapphire substrate, the substrate is divided with a dicer using laser, the dicing tape is stretched with a high-precision expander to spread the individual LEDs so that they are arranged at predetermined intervals, the LEDs are transferred to a sheet or a substrate to supply them to a company manufacturing displays using LED. Herein, processing of a substrate on which LEDs are mounted at approximately equal intervals will be described.

First, the configuration of an LED supply substrate will be described with reference to FIG. 1. FIG. 1 is an overall view of an LED supply substrate. The LED supply substrate is an example of a substrate on which devices, which are the targets of the device transfer method according to the present embodiment, are mounted.

The LED supply substrate is configured by arranging a plurality of LED 2 as a single device in a matrix on a synthetic quartz substrate 1 having both surfaces polished. The LED 2 are arranged at equal intervals within a predetermined accuracy. Assuming that the lattice points arranged at equal intervals in the horizontal directions XY from the center of the synthetic quartz substrate 1 as a reference are ideal positions of the LEDs, the positional accuracy of each LED is defined as the amount of deviation from each of the lattice points and the amount of deviation from a lattice line connecting the lattice points in the rotation direction Q.

FIG. 2 shows the relationship among the LED 2, the lattice point 3, and the lattice line 4. The predetermined accuracy, which depends on the characteristics of the dicing tape and the mechanical accuracy and control of the expander, is within ±30 μm in the horizontal direction XY, and the predetermined accuracy in the rotation direction Θ of each device is within ±1 degree. The positional information acquired in advance by the appearance inspection machine may be coordinate-converted and used as the actual positional information of each LED 2 used in the transfer; however, the following describes a method of timely acquiring the actual positional information in the device-transfer machine.

In a device-transfer machine, a synthetic quartz substrate 1 serving as an LED supply substrate and a carrier substrate 7 are arranged on an XYΘ upper substrate stage and an XYZΘ lower substrate stage, respectively. FIG. 3 shows a schematic diagram showing acquisition of actual positional information. From a reference point, which is the center of the synthetic quartz substrate 1, the device-transfer machine moves on the synthetic quartz substrate 1 so that the observation lens barrel 6 comes directly above the lattice point 5 corresponding to the ideal position of each LED. A control unit (not shown) of the device-transfer machine captures an image of the LED 2 through the quartz substrate 1, and calculates the positional deviation amount from the lattice point 5 through image processing. As shown in FIG. 3, the intervals A and B between the LEDs are not identical and vary within a predetermined accuracy. The above step is repeated for all LEDs on the synthetic quartz substrate 1 and the results are accumulated to be used as actual positional information. In addition, an appearance inspection to find defects other than the positional deviation, such as cracks, chipping, damages, and the like may be performed and may be included in the actual positional information as appearance defect information.

Next, an algorithm for grouping LED2 is described below with reference to FIG. 4. Determination regarding grouping is made for all LEDs individually.

The first determination is made as to whether or not all of the positional deviation amounts of XYΘ are within the criterion value. If this condition is met, the corresponding LED is added to the first group. The criterion value herein refers to a target allowable positional deviation amount in the substrate after the transfer. XY is each ±10 μm, and Θ is ±1 μm as the deviation in the rotation direction is small.

The second determination is made as to whether or not the deviation amount in the positive X direction exceeds the criterion value of 10 μm while falling within 30 μm, which is the value three times the criterion value. If this condition is met, the corresponding LED is added to the second group.

The third determination is made as to whether or not the deviation amount in the negative X direction exceeds the criterion value −10 μm while falling within −30 μm, which is the value three times the criterion value. If this condition is met, the corresponding LED is added to the third group.

In the same manner, determination is performed for the positive/negative Y directions, the four diagonal directions of XY, and the positive/negative Θ directions, and if any one of the conditions are met, the corresponding LED is added to any one of the fourth to eleventh groups, respectively.

If none of the conditions are met, it is determined that the positional deviation amount exceeds the allowable value, or when the actual positional information includes the appearance defect information, the corresponding LED is managed as a defective LED group.

Next, a flow of the transfer operation of the device-transfer machine is described below with reference to FIG. 5.

First, as a first step, the lower substrate stage is moved to a giving/receiving position, a carrier substrate is set, followed by loading to the alignment position. Then the alignment is performed based on the outer shape. More specifically, ends of the carrier substrate are detected using the observation lens barrel, a predetermined alignment operation is performed to match the coordinate system of the stage at the position of the orientation flat (for a circular substrate) or the positions of the ends and the corners (for a square substrate), and the central coordinates and the rotation coordinates of the set carrier substrate on the basis of the observation lens barrel are stored. In the alignment operation, the rotation direction has already been adjusted to match the stage coordinate system.

As a second step, the upper substrate stage is moved to the giving/receiving position, the synthetic quartz substrate is set, followed by loading to the alignment position. Then, the alignment is performed on the basis of the LED. More specifically, the ends of the arranged LEDs are detected using the observation lens barrel, a predetermined alignment operation is performed to match the coordinate system of the stage at the ends thus detected and the corners of the arranged LED, and the central coordinates and the rotation coordinates of the set synthetic quartz substrate on the basis of the observation lens barrel are stored. In the alignment operation, the rotation direction has already been adjusted to match the stage coordinate system.

As a third step, LED arrangement information and allowable positional deviation amounts are input through the GUI of the control unit. The input values of the arrangement information are the total number of LEDS, the number of LEDs in a single row, the column pitch in the X direction, and the row pitch in the Y direction. The input values of the allowable positional deviation amounts are EX in the X direction, EY in the Y direction, and EΘ in the Θ direction. These deviation amounts are regarded as the same values both in the plus direction and the minus direction.

As a fourth step, actual positional information of each LED is acquired based on the input arrangement information. More specifically, ideal position coordinates of the LEDs at the corners are calculated based on the central coordinates of the synthetic quartz substrate and the input arrangement information, and the upper substrate stage is moved to the ideal position coordinates. An image of LED is captured by the observation lens barrel, and a positional deviation amount is calculated by image processing and the calculated amount is stored. This step is repeated for all LEDs to obtain actual positional information.

The grouping based on the actual positional information in the fifth step is as described above with reference to FIG. 4.

As a sixth step, processing operation is performed for each group. The specific processing operation is described below with reference to the processing operation flow shown in FIG. 5. Note that the processing operation is skipped for the defective LED group. When there is a defective LED group, the presence of the defective LED group is displayed on the GUI of the device-transfer machine.

As a first step of the processing operation, the synthetic quartz substrate and the carrier substrate 5 are moved to the processing center of the galvano scanner by using the horizontal distance between the observation lens barrel and the galvano scanner, which is mechanically determined, and the central coordinates of the synthetic quartz substrate and the central coordinates of the carrier substrate 5 on the basis of the observation lens barrel, which are acquired in advance.

As a second step of the processing operation, the synthetic quartz substrate and the carrier substrate 5 are moved on the Z-axis of the lower substrate stage so that the gap between them becomes twice the height of the LED+α; for example, when the height of LED is 100 μm, the gap at the central portion is 220 μm. The reason why the gap is determined at the central portion is that the central portion hangs down depending on the size of the synthetic quartz substrate. If the process range becomes narrow because of the material and strict adjustment is required, the gap at the central portion may be measured every time by a height sensor capable of detecting a transparent body.

As a third step of the processing operation, ideal positional information (coordinate data group) of each LED included in the currently selected group is input to the control unit of the galvano scanner as a laser irradiation position.

As a fourth step of the processing operation, the upper substrate stage is moved by using a correction value corresponding to the currently selected group, thereby correcting the relative positions of the synthetic quartz substrate and the carrier substrate 5. The correction value is specifically described below. For example, when the allowable positional deviation amount EX is 10 μm, the second group of X (+) has a positional deviation of more than 10 μm and within 30 μm in the positive X direction, while the others are within the criterion value. In this case, the correction value is −20 μm in the X direction. Similarly for the other groups, a value obtained by inverting the sign of the value twice the criterion value is used as the correction value.

As the final step of the processing operation, an instruction to conduct the processing is given to the control unit of the galvano scanner. In response to the instruction, the control unit of the galvano scanner performs, for all coordinate data, an operation including adjusting the laser irradiation position based on the input coordinate data group, sending an oscillation trigger to the laser, and irradiating the LED with laser from the back surface of the synthetic quartz substrate. The LEDs thus subjected to the irradiation are ejected by a thermo-mechanical phenomenon and/or a chemical explosion phenomenon and are transferred to the carrier substrate.

The embodiments of the present invention have been described in detail above. On the other hand, the present invention can be expressed as defined in the following (1) to (42) from different viewpoints.

(1) A device transfer method for transferring devices from a first substrate to a second substrate, the method using the first substrate having a surface on which devices are mounted at approximately equal intervals in a state exceeding an allowable positional deviation amount, and the second substrate arranged to face the first substrate with an approximately uniform gap and configured to have an adhesive layer on a surface, the method comprising the steps of:

acquiring actual positional information of the devices on the first substrate;

comparing the actual positional information with ideal positional information of the devices on the first substrate and grouping the devices based on a predetermined criterion determined from the allowable positional deviation amount;

selecting a group to be transferred;

correcting relative positions of the first substrate and the second substrate in a substrate plane direction based on the predetermined criterion of the selected group; and continuously irradiating only the devices included in the selected group with laser from a back surface of the first substrate to transfer the devices to the second substrate.

(2) The device transfer method according to (1), wherein the allowable positional deviation amount is a deviation amount in a vertical direction (X) and/or a horizontal direction (Y) and/or a rotation direction (Θ) of the substrate plane direction relative to the ideal positional information, and the predetermined criterion is equal to or less than the allowable positional deviation amount.

(3) The device transfer method according to (2), wherein the grouping comprises the steps of:

comparing the actual positional information with the ideal positional information and grouping a device in which all of XYΘ are within the predetermined criterion into a first group; and grouping the devices having one of six patterns of positive and negative of X, Y, and Θ which exceeds the predetermined criterion and falls within three times the value of the predetermined criterion with remaining five patterns falling within the predetermined criterion sequentially into second to seventh groups.

(4) The device transfer method according to (2]), wherein the grouping comprises the steps of:

comparing the actual positional information with the ideal positional information and adding the devices within the predetermined criterion into the first group; and selecting at least one or more patterns from ten grouping patterns including six patterns of positive and negative of X, Y, and Θ and four patterns of positive and negative combinations of XY, sequentially performing comparison of the selected patterns, and adding a device in which the pattern subjected to comparison exceeds the predetermined criterion and falls within three times the value of the predetermined criterion with remaining selected patterns falling within the predetermined criterion to a group (second to eleventh group) corresponding to the subsequent selected pattern.

(5) The device transfer method according to any one of (1) to (4), wherein the actual positional information of the devices on the first substrate includes defect information, and the grouping is performed such that no defective devices are included in the group selected for irradiation.

(6) The device transfer method according to any one of (1) to (5), wherein the laser is irradiated through a galvano scanner.

(7) The device transfer method according to any one of (1) to (6), wherein each device is an LED.

(8) The device transfer method according to any one of (1) to (7), wherein the devices are arranged in a matrix on the first substrate.

(9) The device transfer method according to any one of (1) to (8), wherein the devices are arranged within an accuracy of ±30 μm or less in the vertical direction (X) of the plane direction of the first substrate relative to the ideal positional information.

(10) The device transfer method according to any one of (1) to (9), wherein the devices are arranged within an accuracy of ±30 μm or less in the horizontal direction (Y) of the plane direction of the first substrate relative to the ideal positional information.

(11) The device transfer method according to any one of (1) to (10), wherein the devices are arranged within an accuracy of ±1 degree or less in the rotation direction (Θ) of the plane direction of the first substrate relative to the ideal positional information.

(12) A device-transfer machine for transferring devices from a first substrate to a second substrate, the first substrate having a surface on which the devices are mounted at approximately equal intervals in a state exceeding an allowable positional deviation amount, the second substrate being arranged to face the first substrate with an approximately uniform gap and being configured to have an adhesive layer on a surface, the device-transfer machine comprising:

an image processing apparatus for acquiring actual positional information of the devices on the first substrate;

an arithmetic processing apparatus for comparing the actual positional information with ideal positional information of the devices on the first substrate and grouping the devices based on a predetermined criterion determined from the allowable positional deviation amount to select a group to be transferred;

a stage and stage controller for correcting relative positions of the first substrate and the second substrate in a substrate plane direction based on the predetermined criterion of the selected group; and a laser apparatus and a galvano scanner optical system for continuously irradiating only the devices included in the selected group with laser from a back surface of the first substrate.

(13) A target-object transfer method for transferring target objects from a first substrate to a second substrate, the method using the first substrate having a region on which the target objects are positioned in a state exceeding an allowable positional deviation amount, and the second substrate arranged to face the first substrate with a gap, the method comprising the steps of:

acquiring actual positional information of the target objects on the first substrate;

comparing the actual positional information with ideal positional information of the target objects on the first substrate and grouping the target objects;

selecting a group to be transferred; and irradiating the target objects included in the selected group with laser to transfer the target objects to the second substrate.

(14) The target-object transfer method according to (13), wherein the allowable positional deviation amount includes at least one selected from the group consisting of a deviation amount in a vertical direction (X), a deviation amount in a horizontal direction (Y), and a deviation amount in a rotation direction (Θ) of the plane direction of the first substrate relative to the ideal positional information.

(15) The target-object transfer method according to (13) or (14), wherein the ideal positional information and the actual positional information of the target objects on the first substrate are compared, and, in the step of grouping the target objects, the target objects are grouped based on a predetermined criterion determined from the allowable positional deviation amount.

(16) The target-object transfer method according to (15), wherein the allowable positional deviation amount is the predetermined criterion.

(17) The target-object transfer method according to any one of (14) to (16), wherein the allowable positional deviation amount in the vertical direction (X) of the plane direction of the first substrate is within ±10 μm.

(18) The target-object transfer method according to any one of (14) to (17), wherein the allowable positional deviation amount in the horizontal direction (Y) of the plane direction of the first substrate is within ±10 μm.

(19) The target-object transfer method according to any one of (14) to (18), wherein the allowable positional deviation amount in the rotation direction (Θ) of the plane direction of the first substrate is within ±1 degree.

(20) The target-object transfer method according to any one of (15) to (19), wherein the grouping comprises the steps of:

comparing the actual positional information with the ideal positional information and grouping a target object in which at least one of XYΘ is within the predetermined criterion into a first group; and grouping a target object in which at least one of the remaining XYΘ not determined in the first group is within the predetermined criterion or at least one of XYΘ determined in the first group exceeds the predetermined criterion into a second group.

(21) The object transfer method according to any one of (13) to (20), wherein, in the step of irradiating the target objects included in the selected group with the laser to transfer the target objects to the second substrate, the target objects included in the selected group is continuously irradiated with the laser.

(22) The target-object transfer method according to any one of (13) to (21), wherein each target object is a device.

(23) The target-object transfer method according to (22), wherein the device is an LED.

(24) The target-object transfer method according to any one of (13) to (23), wherein the target objects are arranged within an accuracy of ±30 μm or less in the vertical direction (X) of the plane direction of the first substrate relative to the ideal positional information.

(25) The target-object transfer method according to any one of (13) to (24), wherein the target objects are arranged within an accuracy of ±30 μm or less in the horizontal direction (Y) of the plane direction of the first substrate relative to the ideal positional information.

(26) The target-object transfer method according to any one of (13) to (25), wherein the target objects are arranged within an accuracy of ±1 degree or less in the rotation direction (Θ) of the plane direction of the first substrate relative to the ideal positional information.

(27) A target object transfer machine for transferring target objects from a first substrate on which the target objects are arranged in a state exceeding an allowable positional deviation amount to a second substrate arranged to face the first substrate with a gap, comprising:

- an image processing apparatus for acquiring actual positional information of the target objects on the first substrate;
- an arithmetic processing apparatus for comparing the actual positional information with ideal positional information of the target objects on the first substrate and grouping the target objects to select the group to be transferred; and
- a laser apparatus and an optical system for irradiating only the target objects included in the selected group with laser.

(28). The target object transfer machine according to (27), wherein the laser apparatus and the optical system continuously irradiates only the target objects included in the selected group with laser.

(29) The target object transfer machine according to (27) or (28), wherein the optical system is a galvano scanner optical system.

(30) The target object transfer machine according to any one of (27) to (29), wherein the allowable positional deviation amount includes at least one of a deviation amount in a vertical direction (X), a deviation amount in a horizontal direction (Y), and a deviation amount in a rotation direction (Θ), of the plane direction of the first substrate relative to the ideal positional information.

(31) The target object transfer machine according to any one of (27) to (30), wherein the arithmetic processing apparatus performs the grouping based on a predetermined criterion determined from the allowable positional deviation amount.

(32) The target object transfer machine according to (31), wherein the allowable positional deviation amount is the predetermined criterion.

(33) The target object transfer machine according to any one of (27) to (32), wherein the allowable positional deviation amount in the vertical direction (X) of the plane direction of the first substrate is within ±10 μm.

(34) The target object transfer machine according to any one of (27) to (33), wherein the allowable positional deviation amount in the horizontal direction (Y) of the plane direction of the first substrate is within ±10 μm.

(35) The target object transfer machine according to any one of (27) to (34), wherein the allowable positional deviation amount in the rotation direction (Θ) of the plane direction of the first substrate is within ±1 degree.

(36) The target object transfer machine according to any one of (31) to (35), wherein the grouping comprises the steps of:

- comparing the actual positional information with the ideal positional information and grouping a target object in which at least one of XYΘ is within the predetermined criterion into a first group; and
- grouping a target object in which at least one of the remaining XYΘ not determined in the first group is within the predetermined criterion or at least one of XYΘ determined in the first group exceeds the predetermined criterion into a second group.

(37). The target object transfer machine according to any one of (31) to (36), comprising a stage and stage controller for correcting relative positions of the first substrate and the second substrate in a plane direction of the substrate based on the predetermined criterion of the selected group.

(38) The target object transfer machine according to any one of (27) to (37), wherein each target object is a device.

(39) The target object transfer machine according to (38), wherein the device is an LED.

(40) The target object transfer machine according to any one of (27) to (39), wherein the target objects are arranged within an accuracy of ±30 μm or less in the vertical direction (X) of the plane direction of the first substrate relative to the ideal positional information.

(41) The target object transfer machine according to any one of (27) to (40), wherein the target objects are arranged within an accuracy of ±30 μm or less in the horizontal direction (Y) of the plane direction of the first substrate relative to the ideal positional information.

(42) The target object transfer machine according to any one of (27) to (41), wherein the target objects are arranged within an accuracy of ±1 degree or less in the rotation direction (Θ) of the plane direction of the first substrate relative to the ideal positional information.

The present invention can also be expressed as defined in the following (U1) to (U42) from further different viewpoints.

(U1) A device transfer system for transferring devices from a first substrate to a second substrate,

- the system using the first substrate having a surface on which devices are mounted at approximately equal intervals in a state exceeding an allowable positional deviation amount, and the second substrate arranged to face the first substrate with an approximately uniform gap and configured to have an adhesive layer on a surface,
- the system comprising:
- a mechanism of acquiring actual positional information of the devices on the first substrate;
- a mechanism of comparing the actual positional information with ideal positional information of the devices on the first substrate and grouping the devices based on a predetermined criterion determined from the allowable positional deviation amount;
- a mechanism of selecting a group to be transferred;
- a mechanism of correcting relative positions of the first substrate and the second substrate in a substrate plane direction based on the predetermined criterion of the selected group; and
- a mechanism of continuously irradiating only the devices included in the selected group with laser from a back surface of the first substrate to transfer the devices to the second substrate.

(U2) The device transfer system according to (U1), wherein the allowable positional deviation amount is a deviation amount in a vertical direction (X) and/or a horizontal direction (Y) and/or a rotation direction (Θ) of the substrate plane direction relative to the ideal positional information, and the predetermined criterion is equal to or less than the allowable positional deviation amount.

(U3) The device transfer system according to (U2), wherein the grouping comprises the steps of:

- comparing the actual positional information with the ideal positional information and grouping a device in which all of XYΘ are within the predetermined criterion into a first group; and
- grouping the devices having one of six patterns of positive and negative of X, Y, and Θ which exceeds the predetermined criterion and falls within three times the value of the predetermined criterion with remaining five patterns falling within the predetermined criterion sequentially into second to seventh groups.

(U4) The device transfer system according to (U2), wherein the grouping comprises the steps of:

comparing the actual positional information with the ideal positional information and adding the devices within the predetermined criterion into the first group; and selecting at least one or more patterns from ten grouping patterns including six patterns of positive and negative of X, Y, and Θ and four pattern of positive and negative combinations of XY, sequentially performing comparison of the selected patterns, and adding a device in which the pattern subjected to comparison exceeds the predetermined criterion and falls within three times the value of the predetermined criterion with remaining selected patterns falling within the predetermined criterion to a group (second to eleventh group) corresponding to the subsequent selected pattern.

(U5) The device transfer system according to any one of (U1) to (U4), wherein the actual positional information of the devices on the first substrate includes defect information, and the grouping is performed such that no defective devices are included in the group selected for irradiation.

(U6) The device transfer system according to any one of (U1) to (U5), wherein the laser is irradiated through a galvano scanner.

(U7) The device transfer system according to any one of (U1) to (U6), wherein each device is an LED.

(U8) The device transfer system according to any one of (U1) to (U7), wherein the devices are arranged in a matrix on the first substrate.

(U9) The device transfer system according to any one of (U1) to (U8), wherein the devices are arranged within an accuracy of ±30 μm or less in the vertical direction (X) of the plane direction of the first substrate relative to the ideal positional information.

(U10) The device transfer system according to any one of (U1) to (U9), wherein the devices are arranged within an accuracy of ±30 μm or less in the horizontal direction (Y) of the plane direction of the first substrate relative to the ideal positional information.

(U11) The device transfer system according to any one of (U1) to (U10), wherein the devices are arranged within an accuracy of ±1 degree or less in the rotation direction (Θ) of the plane direction of the first substrate relative to the ideal positional information.

(U12) A device-transfer machine with a substrate on which a first substrate is provided, for transferring devices from the first substrate to a second substrate, the first substrate having a surface on which the devices are mounted at approximately equal intervals in a state exceeding an allowable positional deviation amount, the second substrate being arranged to face the first substrate with an approximately uniform gap and being configured to have an adhesive layer on a surface, the device-transfer machine comprising:

an image processing apparatus for acquiring actual positional information of the devices on the first substrate;

an arithmetic processing apparatus for comparing the actual positional information with ideal positional information of the devices on the first substrate and grouping the devices based on a predetermined criterion determined from the allowable positional deviation amount to select a group to be transferred;

a stage and stage controller for correcting relative positions of the first substrate and the second substrate in a substrate plane direction based on the predetermined criterion of the selected group; and a laser apparatus and a galvano scanner optical system for continuously irradiating only the devices included in the selected group with laser from a back surface of the first substrate.

(U13) A target-object transfer system for transferring target objects from a first substrate to a second substrate, the system using the first substrate having a region on which the target objects are positioned in a state exceeding an allowable positional deviation amount, and the second substrate arranged to face the first substrate with a gap, the system comprising:

a mechanism of acquiring actual positional information of the target objects on the first substrate;

a mechanism of comparing the actual positional information with ideal positional information of the target objects on the first substrate and grouping the target objects;

a mechanism of selecting a group to be transferred; and a mechanism of irradiating the target objects included in the selected group with laser to transfer the target objects to the second substrate.

(U14) The target-object transfer system according to (U13), wherein the allowable positional deviation amount includes at least one selected from the group consisting of a deviation amount in a vertical direction (X), a deviation amount in a horizontal direction (Y), and a deviation amount in a rotation direction (Θ) of the plane direction of the first substrate relative to the ideal positional information.

(U15) The target-object transfer system according to (U13) or (U14), wherein the ideal positional information and the actual positional information of the target objects on the first substrate are compared, and, in the step of grouping the target objects, the target objects are grouped based on a predetermined criterion determined from the allowable positional deviation amount.

(U16) The target-object transfer system according to (U15), wherein the allowable positional deviation amount is the predetermined criterion.

(U17) The target-object transfer system according to any one of (U14) to (U16), wherein the allowable positional deviation amount in the vertical direction (X) of the plane direction of the first substrate is within ±10 μm.

(U18) The target-object transfer system according to any one of (U14) to (U17), wherein the allowable positional deviation amount in the horizontal direction (Y) of the plane direction of the first substrate is within ±10 μm.

(U19) The target-object transfer system according to any one of (U14) to (U18), wherein the allowable positional deviation amount in the rotation direction (Θ) of the plane direction of the first substrate is within ±1 degree.

(U20) The target-object transfer system according to any one of (U15) to (U19), wherein the grouping comprises the steps of:

comparing the actual positional information with the ideal positional information and grouping a target object in which at least one of XYΘ is within the predetermined criterion into a first group; and grouping a target object in which at least one of the remaining XYΘ not determined in the first group is within the predetermined criterion or at least one of XYΘ determined in the first group exceeds the predetermined criterion into a second group.

(U21) The object transfer system according to any one of (U13) to (U20), wherein, in the step of irradiating the target objects included in the selected group with the laser to transfer the target objects to the second substrate, the target objects included in the selected group is continuously irradiated with the laser.

(U22) The target-object transfer system according to any one of (U13) to (U21), wherein each target object is a device.

(U23) The target-object transfer system according to (U22), wherein the device is an LED.

(U24) The target-object transfer system according to any one of (U13) to (U23), wherein the target objects are arranged within an accuracy of ±30 μm or less in the vertical direction (X) of the plane direction of the first substrate relative to the ideal positional information.

(U25) The target-object transfer system according to any one of (U13) to (U24), wherein the target objects are arranged within an accuracy of ±30 μm or less in the horizontal direction (Y) of the plane direction of the first substrate relative to the ideal positional information.

(U26) The target-object transfer system according to any one of (U13) to (U25), wherein the target objects are arranged within an accuracy of ±1 degree or less in the rotation direction (Θ) of the plane direction of the first substrate relative to the ideal positional information.

(U27) A target object transfer machine with a substrate on which a first substrate is provided, for transferring target objects from the first substrate on which the target objects are arranged in a state exceeding an allowable positional deviation amount to a second substrate arranged to face the first substrate with a gap, comprising:

- an image processing apparatus for acquiring actual positional information of the target objects on the first substrate;
- an arithmetic processing apparatus for comparing the actual positional information with ideal positional information of the target objects on the first substrate and grouping the target objects to select the group to be transferred; and
- a laser apparatus and an optical system for irradiating only the target objects included in the selected group with laser.

(U28) The target object transfer machine with a substrate according to (U27), wherein the laser apparatus and the optical system continuously irradiates only the target objects included in the selected group with laser.

(U29) The target object transfer machine with a substrate according to (U27) or (U28), wherein the optical system is a galvano scanner optical system.

(U30) The target object transfer machine with a substrate according to any one of (U27) to (U29), wherein the allowable positional deviation amount includes at least one of a deviation amount in a vertical direction (X), a deviation amount in a horizontal direction (Y), and a deviation amount in a rotation direction (Θ), of the plane direction of the first substrate relative to the ideal positional information.

(U31) The target object transfer machine with a substrate according to any one of (U27) to (U30), wherein the arithmetic processing apparatus performs the grouping based on a predetermined criterion determined from the allowable positional deviation amount.

(U32) The target object transfer machine with a substrate according to (U31), wherein the allowable positional deviation amount is the predetermined criterion.

(U33) The target object transfer machine with a substrate according to any one of (U27) to (U32), wherein the allowable positional deviation amount in the vertical direction (X) of the plane direction of the first substrate is within ±10 μm.

(U34) The target object transfer machine with a substrate according to any one of (U27) to (U33), wherein the allowable positional deviation amount in the horizontal direction (Y) of the plane direction of the first substrate is within ±10 μm.

(U35) The target object transfer machine with a substrate according to any one of (U27) to (U34), wherein the allowable positional deviation amount in the rotation direction (Θ) of the plane direction of the first substrate is within ±1 degree.

(U36) The target object transfer machine with a substrate according to any one of (U31) to (U35), wherein the grouping comprises the steps of:

- comparing the actual positional information with the ideal positional information and grouping a target object in which at least one of XYΘ is within the predetermined criterion into a first group; and
- grouping a target object in which at least one of the remaining XYΘ not determined in the first group is within the predetermined criterion or at least one of XYΘ determined in the first group exceeds the predetermined criterion into a second group.

(U37) The target object transfer machine with a substrate according to any one of (U31) to (U36), comprising a stage and stage controller for correcting relative positions of the first substrate and the second substrate in a plane direction of the substrate based on the predetermined criterion of the selected group.

(U38) The target object transfer machine with a substrate according to any one of (U27) to (U37), wherein each target object is a device.

(U39) The target object transfer machine with a substrate according to (U38), wherein the device is an LED.

(U40) The transfer machine with a substrate according to any one of (U27) to (U39), wherein the target objects are arranged within an accuracy of ±30 μm or less in the vertical direction (X) of the plane direction of the first substrate relative to the ideal positional information.

(U41) The target object transfer machine with a substrate according to any one of (U27) to (U40), wherein the target objects are arranged within an accuracy of ±30 μm or less in the horizontal direction (Y) of the plane direction of the first substrate relative to the ideal positional information.

(U42) The target object transfer machine with a substrate according to any one of (U27) to (U41), wherein the target objects are arranged within an accuracy of ±1 degree or less in the rotation direction (Θ) of the plane direction of the first substrate relative to the ideal positional information.

For these mechanisms, each mechanism may have a function different from each other, or a single mechanism may have a plurality of functions.

INDUSTRIAL APPLICABILITY

The present invention is applicable to a device transfer method and a device-transfer machine.

REFERENCE NUMERALS

1. Synthetic quartz substrate
2. LED
3. Lattice point
4. Lattice line
5. Carrier substrate
6. Observation lens barrel

The invention claimed is:

1. A target-object transfer method for operating a transfer of target objects from a first substrate to a second substrate, the method using the first substrate having a region on which the target objects are positioned in a state exceeding an allowable positional deviation amount, and the second substrate arranged to face the first substrate with a gap, the method comprising the steps of:

acquiring actual positional information of the target objects on the first substrate;

comparing the actual positional information with ideal positional information of the target objects on the first substrate and grouping the target objects based on a positional deviation amount of the target objects;

selecting a group to be transferred;

correcting relative positions of the first substrate and the second substrate in a substrate plane direction of the first substrate by a correction value corresponding to the selected group; and controlling the transfer of the target objects in the selected group to the second substrate by irradiation of laser adjusted so as to irradiate corrected relative positions.

2. The target-object transfer method according to claim 1, wherein the allowable positional deviation amount includes at least one selected from the group consisting of a deviation amount in a vertical direction (X), a deviation amount in a horizontal direction (Y), and a deviation amount in a rotation direction (Θ) of the plane direction of the first substrate relative to the ideal positional information.

3. The target-object transfer method according to claim 1, wherein the ideal positional information and the actual positional information of the target objects on the first substrate are compared, and, in the step of grouping the target objects, the target objects are grouped based on a predetermined criterion determined from the allowable positional deviation amount.

4. The target-object transfer method according to claim 3, wherein the allowable positional deviation amount is the predetermined criterion.

5. The target-object transfer method according to claim 2, wherein the allowable positional deviation amount in the vertical direction (X) of the plane direction of the first substrate is within ±10 μm.

6. The target-object transfer method according to claim 2, wherein the allowable positional deviation amount in the horizontal direction (Y) of the plane direction of the first substrate is within ±10 μm.

7. The target-object transfer method according to claim 2, wherein the allowable positional deviation amount in the rotation direction (Θ) of the plane direction of the first substrate is within ±1 degree.

8. The target-object transfer method according to claim 3, wherein the grouping comprises the steps of:

comparing the actual positional information with the ideal positional information and grouping a target object in which at least one of XYΘ is within the predetermined criterion into a first group; and grouping a target object in which at least one of the remaining XYΘ not determined in the first group is within the predetermined criterion or at least one of XYΘ determined in the first group exceeds the predetermined criterion into a second group.

9. The target-object transfer method according to claim 1, wherein each target object is a device.

10. The target-object transfer method according to claim 9, wherein the device is an LED.

11. The target-object transfer method according to claim 1, wherein the target objects are arranged within an accuracy of ±30 μm or less in the vertical direction (X) of the plane direction of the first substrate relative to the ideal positional information.

12. The target-object transfer method according to claim 1, wherein the target objects are arranged within an accuracy of ±30 μm or less in the horizontal direction (Y) of the plane direction of the first substrate relative to the ideal positional information.

13. The target-object transfer method according to claim 1, wherein the target objects are arranged within an accuracy of ±1 degree or less in the rotation direction (Θ) of the plane direction of the first substrate relative to the ideal positional information.

14. A target-object transfer method for operating a transfer of target objects from a first substrate to a second substrate, the method using the first substrate having a region on which the target objects are positioned in a state where the targets objects have a positional deviation, and the second substrate arranged to face the first substrate with a gap, the method comprising the steps of:

acquiring actual positional information of the target objects on the first substrate;

comparing the actual positional information with ideal positional information of the target objects on the first substrate and grouping the target objects based on a positional deviation amount of the target objects;

selecting a group to be transferred;

correcting relative positions of the first substrate and the second substrate in a substrate plane direction of the first substrate by a correction value corresponding to the selected group; and controlling the transfer of the target objects in the selected group to the second substrate by irradiation of laser adjusted so as to irradiate corrected relative positions.

15. The target-object transfer method according to claim 14, wherein the targe objects are devices, and the targe objects on the first substrate are devices having been spread at predetermined intervals after subjected to dicing to individual devices.

16. The target-object transfer method according to claim 15, wherein the individual devices are spread at the predetermined intervals by stretching a dicing tape and transferred to a sheet or a substrate.

* * * * *